US005723889A

United States Patent [19]
Choi et al.

[11] Patent Number: 5,723,889
[45] Date of Patent: Mar. 3, 1998

[54] SEMICONDUCTOR MEMORY DEVICE AND METHOD FOR FABRICATING THE SAME

[75] Inventors: Jong Mun Choi, Seoul; Chang Yeol Kim; Woun-Suck Yang, both of Chungcheongbuk-do, all of Rep. of Korea

[73] Assignee: LG Semicon Co., Ltd., Chungcheongbuk-do, Rep. of Korea

[21] Appl. No.: 520,435

[22] Filed: Aug. 29, 1995

[30] Foreign Application Priority Data

Nov. 21, 1994 [KR] Rep. of Korea ............... 30588/1994

[51] Int. Cl.$^6$ .................... H01L 29/76; H01L 21/465
[52] U.S. Cl. ................... 257/329; 257/296; 257/301; 257/304; 257/330; 257/401; 257/506; 257/618; 437/34; 437/141; 437/228; 437/235; 437/913
[58] Field of Search ........................ 257/304, 301, 257/296, 329, 330, 401, 506, 618; 437/34, 141, 228, 235, 913

[56] References Cited

U.S. PATENT DOCUMENTS

| 5,214,296 | 5/1993 | Nakata et al. | 257/71 |
| 5,336,917 | 8/1994 | Kohyama | 257/304 |

*Primary Examiner*—Edward Wojciechowicz
*Attorney, Agent, or Firm*—Morgan, Lewis & Bockius LLP

[57] ABSTRACT

A semiconductor memory device includes a semiconductor substrate, a first insulation film formed on the substrate, a trench formed in the substrate, an opening formed in the first insulation film above the trench, a capacitor including a dielectric film formed in the trench and a storage node formed in the trench on the dielectric film, a transfer transistor including a channel layer formed in the opening on the storage node, a gate insulation film formed on the channel layer, and a gate electrode formed on the gate insulation film, a second insulation film formed on the gate electrode, a conduction layer formed on the second insulation film, a third insulation film in contact with the channel layer, and a bit line in contact with the conduction layer.

28 Claims, 11 Drawing Sheets

F I G.5i
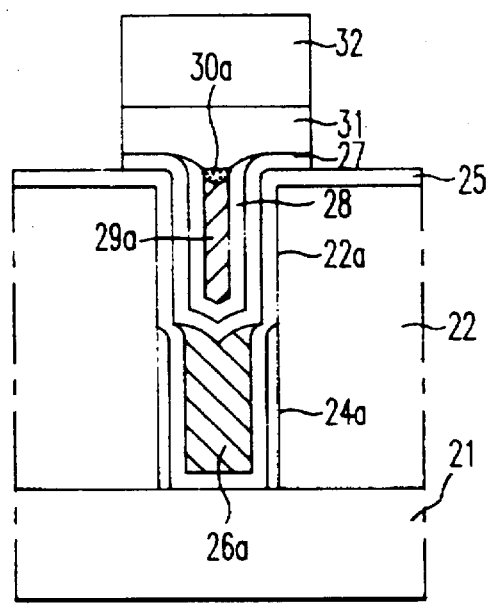
F I G.5j
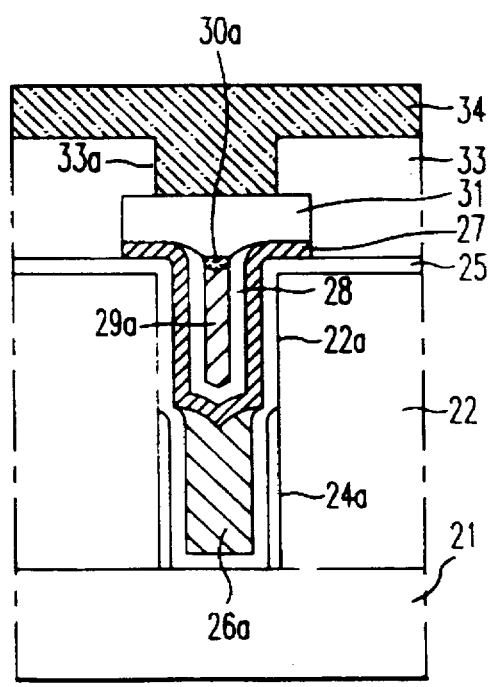

5,723,889

1

SEMICONDUCTOR MEMORY DEVICE AND METHOD FOR FABRICATING THE SAME

BACKGROUND OF THE INVENTION

1. Field of the Invention

This invention relates to a semiconductor memory device and to a method for fabricating the same.

2. Discussion of the Related Art

FIGS. 1a and 1b illustrate conventional DRAM (Dynamic Random Access Memory) cells, wherein FIG. 1a is a sectional illustration of a trenched capacitor DRAM cell and FIG. 1b is a sectional illustration of a stacked capacitor DRAM cell.

The trenched capacitor DRAM cell of FIG. 1a includes a transfer transistor, a capacitor, and a bit line 45. The transfer transistor comprises a gate 42, a source 44, and a drain 43 formed on a semiconductor substrate 41. The bit line 45 is in contact with the source 44. The capacitor is in contact with the drain 42 and comprises an insulation film 46, which acts as a dielectric film and which is formed inside of a trench at one side of the semiconductor substrate 41. The capacitor also comprises a storage node 47 formed on the insulation film 46.

The stacked capacitor DRAM cell of FIG. 1b includes a planar transfer transistor, a stacked capacitor, and a bit line 55. The planar transfer transistor comprises gates 52, a source 54, and a drain 53 formed on a substrate 51. The stacked capacitor is in contact with the drain 53 and comprises a storage node 56, a dielectric film 57, and a plate electrode 58. The bit line 55 is in contact with the source 54.

Because the bit line contact and the transfer transistor node contact of the foregoing conventional DRAM cell are formed planar on the substrate, the cell areas are significantly increased. As a result, high density integration is limited for such DRAM cells.

Furthermore, since isolation between the cells is accomplished using either a trench or a LOCOS (Local Oxidation Of Silicon) method, the cell areas are further increased when the cells are arranged planar.

Moreover, as shown in FIG. 1b, where has the capacitor has a stacked structure, the step size in the cell increases as the capacity of the capacitor is increased.

SUMMARY OF THE INVENTION

The present invention has been made in view of the above circumstances and has as an object to provide a semiconductor memory device and a method for fabricating the same, which can reduce the area occupied by the cells suitable for high density integration of the cells by vertically forming the capacitor, the transfer transistor, and the bit line contact.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor memory device of this invention comprises a semiconductor substrate, a first insulation film formed on the substrate, a trench formed in the substrate, an opening formed in the first insulation film above the trench,

2 a capacitor including a dielectric film formed in the trench and a storage node formed in the trench on the dielectric film, a transfer transistor including a channel layer formed in the opening on the storage node, a gate insulation film formed on the channel layer, and a gate electrode formed on the gate insulation film, a second insulation film formed on the gate electrode, a conduction layer formed on the second insulation film, a third insulation film in contact with the channel layer, and a bit line in contact with the conduction layer.

To further achieve the objects and in accordance with the purpose of the invention, as embodied and broadly described herein, the method for fabricating the semiconductor memory device of this invention comprises the steps of forming a first insulation film on a semiconductor substrate, forming an opening in the first insulation film by selectively etching the first insulation film, forming a trench in the semiconductor substrate below the opening by etching the semiconductor substrate, forming a dielectric film in the trench and the opening and on the first insulation film, forming a storage node in the trench on the dielectric film, forming a channel layer on the dielectric film and the storage node, forming a gate insulation film on the channel layer, forming a gate electrode on the gate insulation film and in the opening, forming a second insulation film on the gate electrode, etching the channel layer except in the vicinity of the opening, forming a conduction layer on the gate insulation film, the channel layer, and the second insulation film, patterning the conduction layer and the channel layer, forming a third insulation film on the exposed dielectric film, exposing a surface of the conductive layer by selectively etching the third insulation film, and forming a bit line on the third insulation film in contact with the exposed surface of the conduction layer.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIGS. 5a–5j are sectional views of a DRAM cell during fabrication of the DRAM cell in accordance with the second embodiment of the present invention.

DETAILED DESCRIPTION OF THE INVENTION

The present invention will now be explained in detail with reference to the attached drawings.

Figure 1A:
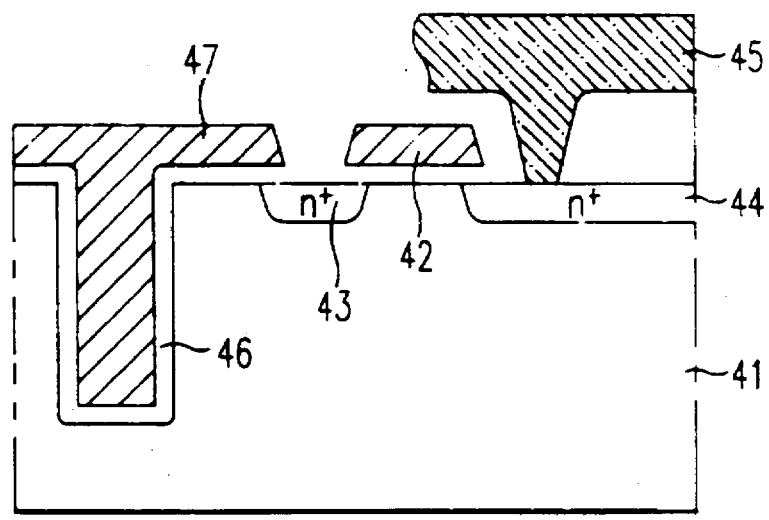
FIGS. 1a and 1b are sectional views of conventional DRAM cells.
Figure 1B:
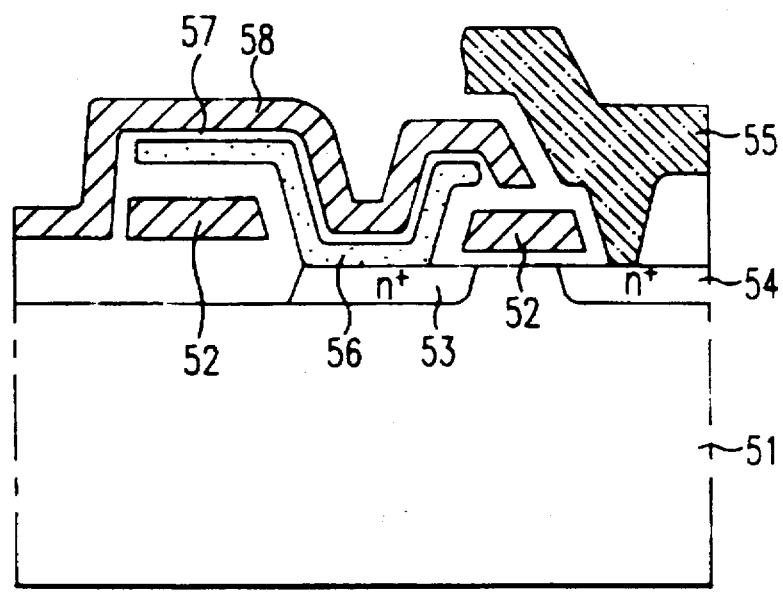
Figure 2:
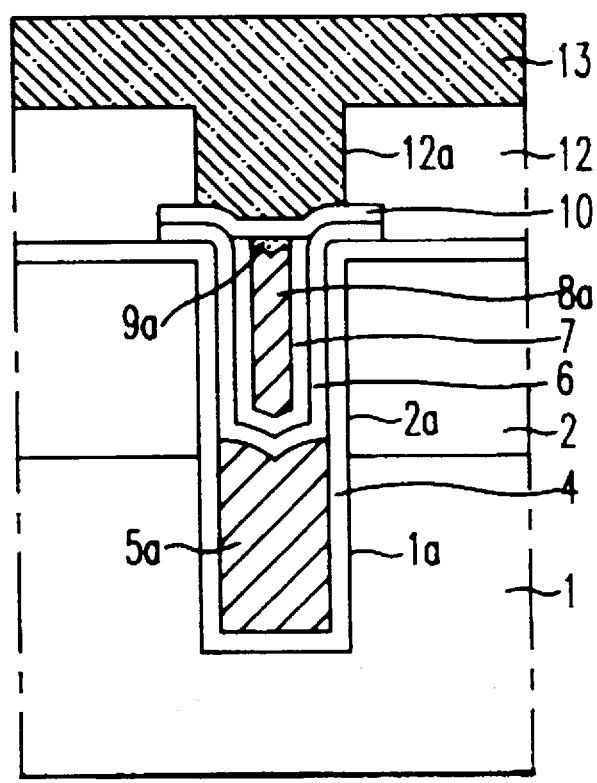
FIG. 2 is a sectional view of a DRAM cell in accordance with a first embodiment of the invention.

As shown in FIG. 2, a DRAM cell in accordance with a first embodiment of the invention comprises a capacitor and a transfer transistor. The capacitor includes a dielectric film 4 formed on the inside walls of a trench 1a in a predetermined part of a semiconductor substrate 1, and a storage node 5a buried in the trench 1a over the dielectric film 4. The dielectric film 4 extends beyond the inside walls of the trench 1a and the sidewalls of the opening 2a, and formed above an insulation film 2.

The transfer transistor includes an opening 2a formed in the insulation film 2 on the semiconductor substrate 1, a channel layer 6 formed on the dielectric film 4 and on the top of the storage node 5a, a gate insulation film 7 formed on the channel layer 56, and a gate electrode 8a formed in the opening 2a over the gate insulation film 7. An insulation film 9a is formed on the gate electrode 8a, a third conduction layer 10 is formed on the insulation film 9a and the channel layer 6, and a bit line 13 is in contact with the third conduction layer 10. The transfer transistor, which is formed on top of the capacitor in the trench 1a of the substrate 1, has the structure of a thin film transistor comprising the channel layer 6, the gate insulation film 7 on the channel layer 6, and the gate electrode 8a on the gate insulation film 7.

A method for fabricating a DRAM cell having the foregoing construction will now be explained in detail with reference to FIGS. 3a–3j.

Figure 3A:
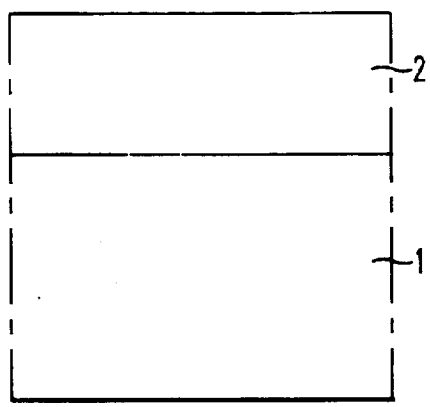
FIGS. 3a–3j are sectional views of a DRAM cell during fabrication of the DRAM cell in accordance with the first embodiment of the present invention.

First, as shown in FIG. 3a, a first insulation film 2, for example, an oxide film, is formed on a silicon substrate 1.

Figure 3B:
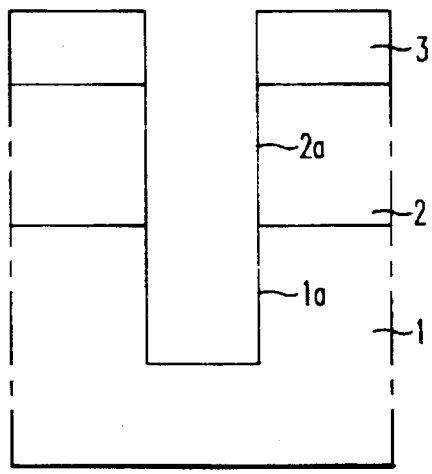

Then, as shown in FIG. 3b, a photosensitive film is coated on the first insulation film 2 and exposed and developed into a predetermined photosensitive film pattern 3. An opening 2a is next formed by selective etching of the first insulation film 2 using the photosensitive film pattern 3 as a mask, and then a trench 1a is formed by etching the exposed substrate 1 to a predetermined depth. At this time, a well can be formed in a region of the substrate 1, wherein the trench 1a can be formed by doping the region of the substrate 1, before forming the trench 1a therein.

Figure 3C:
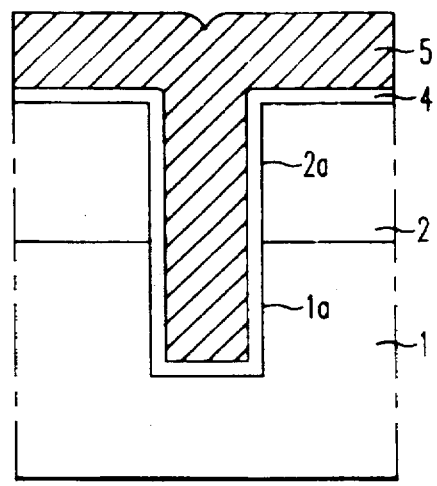

Next, as shown in FIG. 3c, after removing the photosensitive film pattern 3, for example, an NO (Nitride Oxide) is deposited as a dielectric film 4 of a capacitor on the first insulation film 2 including inside walls of the trench 1a and the opening 2a. A first conduction layer 5, of a doped polycrystalline silicon for example, is deposited on the substrate 1 so that it fully fills the trench 1a formed in the substrate 1 as well as the opening 2a formed in the first insulation film 2.

Figure 3D:
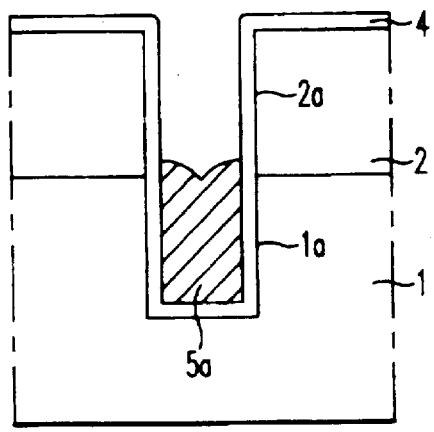

Then, as shown in FIG. 3d, by etching the first conduction layer 5 back up to a surface of the substrate 1, a capacitor storage node 5a is formed buried in the trench 1a.

Figure 3E:
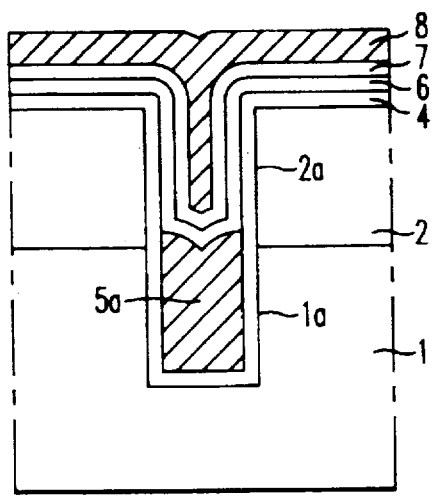

Next, as shown in FIG. 3e, a silicon film is formed on the storage node 5a and the dielectric film 4 as a channel layer 6 of the transfer transistor, on which a gate oxide film 7 is formed. Then, as a second conduction layer 8 to be used as a gate electrode of the transfer transistor, doped polycrystalline silicon, for example, is deposited on the gate oxide film 7 so as to fill the opening formed in the gate oxide film 7.

Figure 3F:
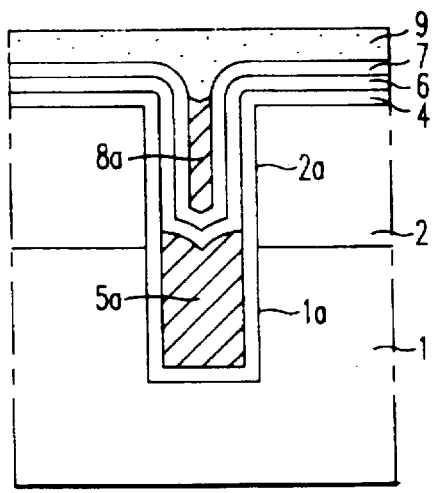
Figure 3G:
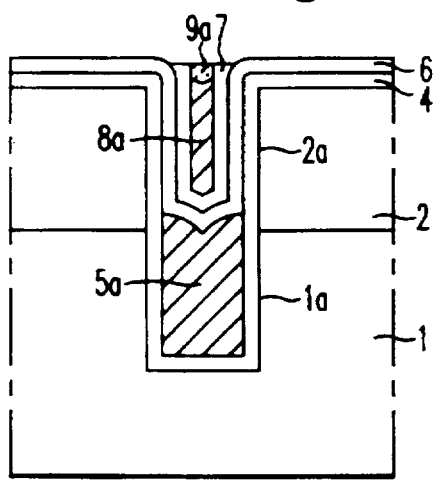

Then, as shown in FIG. 3f, by etching the second conduction layer 8 back, a gate electrode 8a is formed in the opening covered with the gate oxide film 7. As a second insulation film 9, an oxide film, such as USG (Undoped Silicate Glass) film, is formed on the gate oxide film 7 including the gate electrode 8a.

Figure 5A:
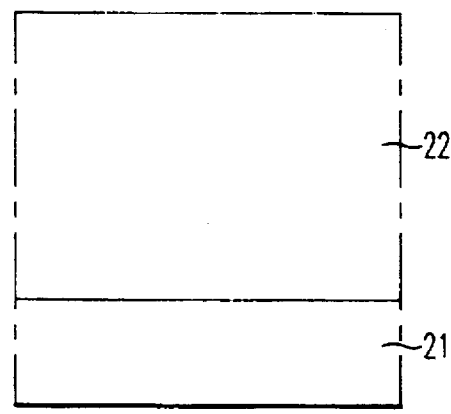
Figure 5B:
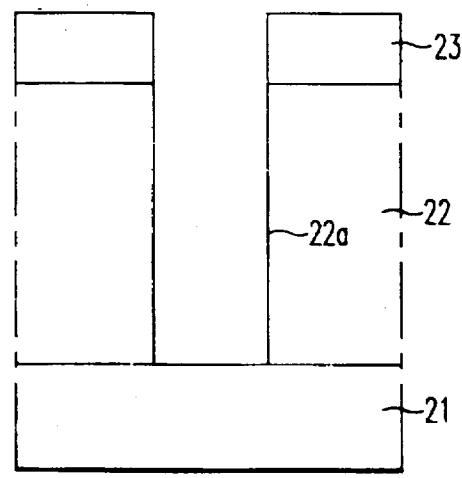
Figure 5C:
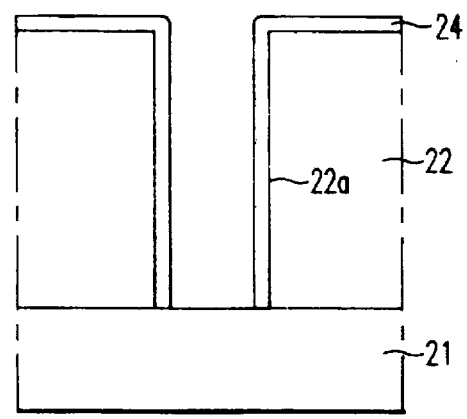
Figure 5D:
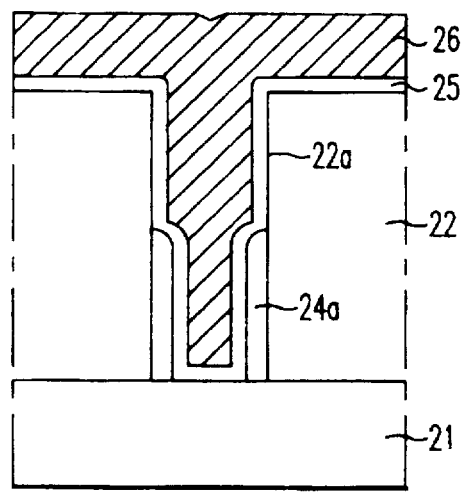
Figure 5E:
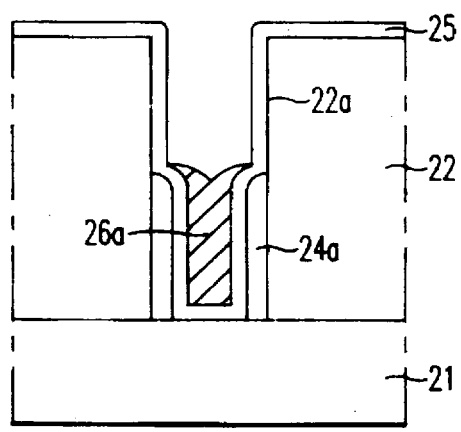
Figure 5F:
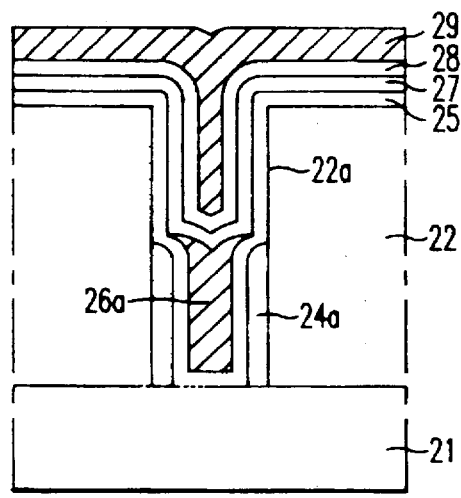
Figure 5G:
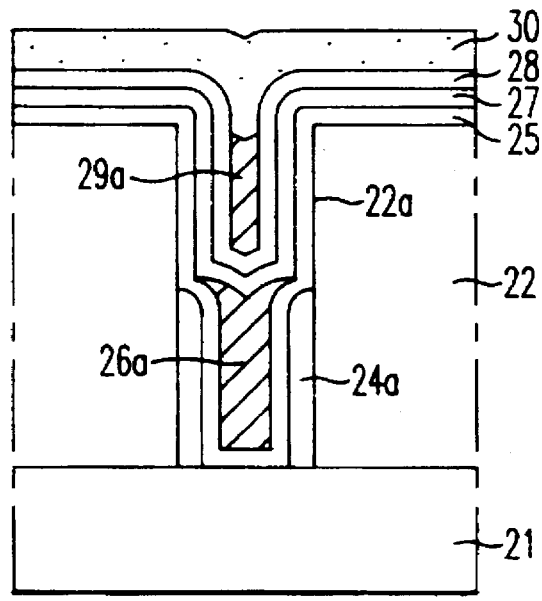

Next, as shown in FIG. 5g, the oxide film is etched back leaving an insulation film 9a on the gate electrode 8a, and part of the gate oxide film 7 exposed by the above process is etched thereby exposing the channel layer 6 on the dielectric film 4.

Figure 3H:
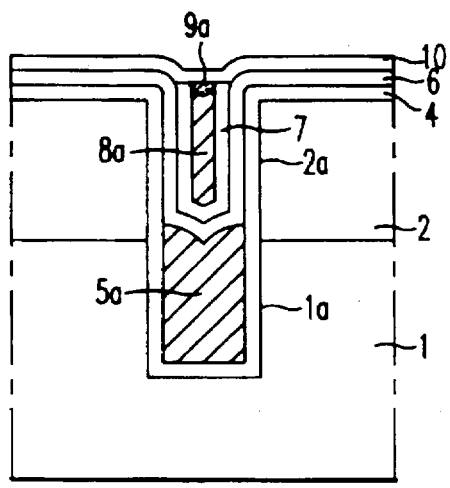

Next, as shown in FIG. 3h, by depositing, for example, a doped polycrystalline silicon on the channel layer 6 to be in contact with the exposed channel layer 6, a conduction layer 10 is formed as a third conduction layer.

Figure 3I:
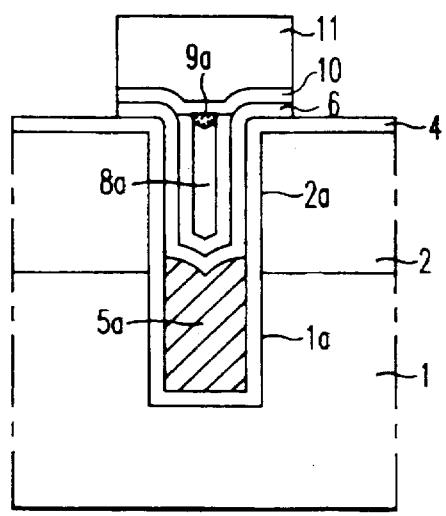

Next, as shown in FIG. 3i, a photosensitive film is coated on the conduction layer 10, which is exposed selectively and developed into a predetermined photosensitive film pattern 11. The conduction layer 10 and the channel layer 6 are etched successively using the photosensitive film pattern 11 as a mask.

Figure 3J:
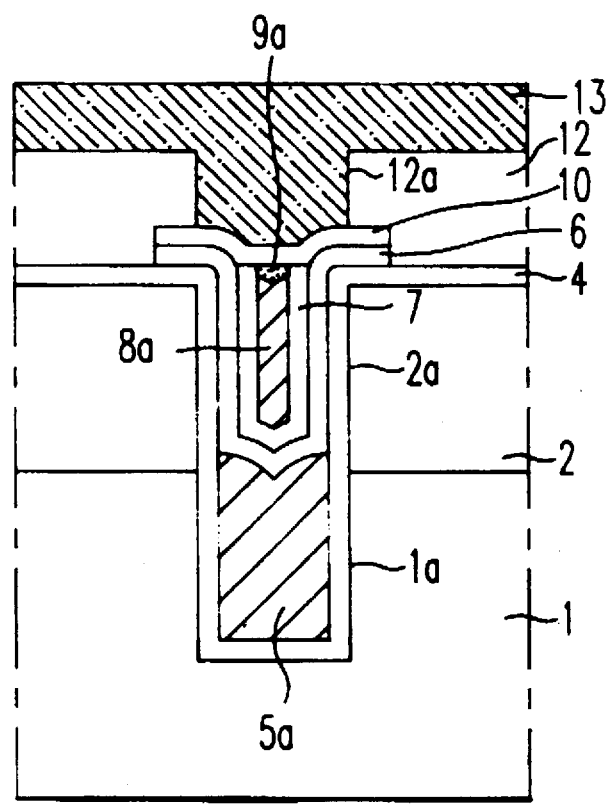

Then, as shown in FIG. 3j, the photosensitive film pattern 11 is removed, and a third insulation film 12, such as an oxide film, is formed on the dielectric film 4. The third insulator film 12 is subjected to selective removal to form an opening 12a exposing a surface of the conduction layer 10 for a bit line contact. Then, a metal layer is formed on the entire surface thereof, which is patterned with a predetermined pattern into the bit line 13.

In this process, since a part of the channel layer 6 in contact with the top of the capacitor storage node 5a is doped with impurities from the doped polycrystalline silicon of the storage node 5a, a drain region is formed therein. Furthermore, since a part of the channel layer 6 in contact with the conduction layer 10 to be used for the bit line contact is doped with impurities from the doped polycrystalline silicon of the conduction layer, a source region is formed therein.

Because the DRAM cell of this invention formed through the foregoing processes is vertically arranged on the substrate 1 with the capacitor having a storage node 5a and a dielectric film 4 formed between the storage node 5a and the substrate 1, with the TFT (Thin Film Transistor) structured transfer transistor having the channel layer 6, the gate insulation film 7, and a gate electrode 8a formed over the capacitor, and with the bit line 13 connected to a top of the transfer transistor, the area occupied by the cell is reduced and high density integration of a semiconductor memory device is possible.

Figure 4:
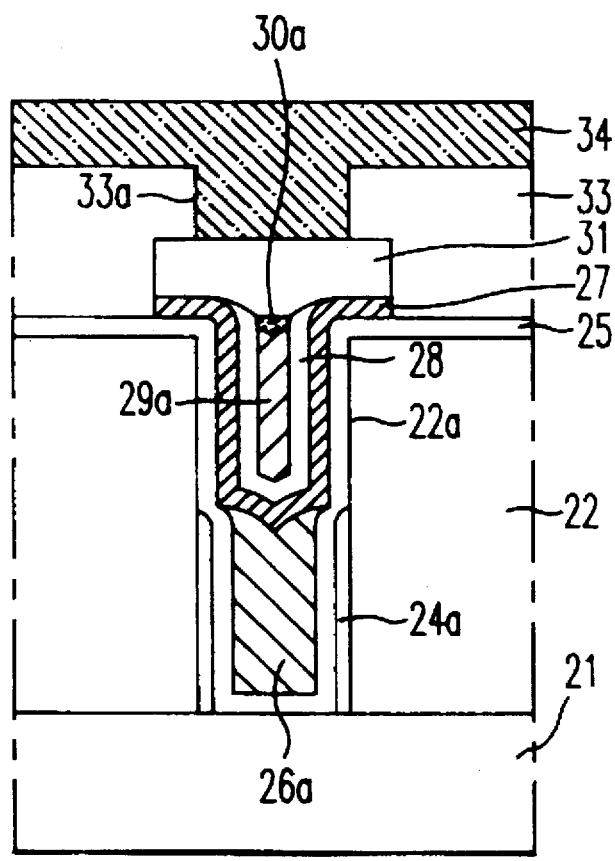
FIG. 4 is a sectional view of a DRAM cell in accordance with a second embodiment of the invention.

As shown in FIG. 4, a DRAM cell in accordance with a second embodiment of the present invention comprises a capacitor and a transfer transistor. The capacitor includes a first capacitor electrode 24a formed on the lower part of the inside wall of an opening 22a formed in a first insulation film 22 on a semiconductor substrate 21. A dielectric film 25 is formed on the first capacitor electrode 24a, and a second capacitor electrode of a storage node 26a is buried in the opening 22a of which the inside has been covered by the dielectric film 25.

The transfer transistor includes a channel layer 27 formed on top of the storage node 26a and on the sides of the dielectric film 25 in the opening 22a. The transistor also includes a gate insulation film 28 formed on the channel layer 27 and a gate electrode 29a formed on the gate insulation film 28 buried in the opening which has been covered by the gate insulation film 28.

An insulation film 30a is formed on the gate electrode 29a, a third conduction layer 31 is formed on the insulation film 30a and the channel layer 27, and a bit line 34 is in contact with the third conduction layer 31. The dielectric film 25 of the capacitor is formed on the inside surface of the opening 22a having the first capacitor electrode 24a formed therein and on the first insulation film 22.

As shown in FIG. 4, the transfer transistor, formed on an upper part of the capacitor in a lower part of the opening 22a, has a structure of a thin film transistor comprising the channel layer 27, the gate insulation film 28 on the channel layer 27, and the gate electrode 29a on the gate insulation film 28.

A method for forming a DRAM cell having the foregoing construction will now be explained with reference to FIGS. 5a–5j.

First, as shown in FIG. 5a, as a first insulation film 22, for example, an oxide film, is formed on a silicon substrate 21.

Then, as shown in FIG. 5b, a photosensitive film is coated on the first insulation film 22, and then is exposed selectively and developed into a predetermined photosensitive film pattern 23. By selective etching of the first insulation film 22 using the photosensitive film pattern 23 as a mask, an opening 22a is formed.

Next, as shown in FIG. 5c, after removing the photosensitive film pattern 23, a conduction layer 24 as a first capacitor electrode of a polycrystalline silicon film, for example, is formed on the first insulation film 22.

As shown in FIG. 5d, by etching the polycrystalline silicon film back, a first capacitor electrode 24a is formed at lower side walls of the opening 22a formed in the first insulation film 22. As a capacitor, dielectric film 25, such as an NO (Nitride Oxide), is deposited on the inside surface of the opening 22a, i.e., on the first electrode 24a and on the first insulation film 22. A first conduction layer 26 is formed as a second capacitor electrode by depositing doped polycrystalline silicon, for example, so that the opening 22a is fully filled.

Then, as shown in FIG. 5e, the storage node 26a is formed by etching the polycrystalline silicon layer back to where the first capacitor electrode 24a has been formed.

Next, as shown in FIG. 5f, a channel layer 27 of the transfer transistor is formed as a silicon film on the storage node 26a and the dielectric film 25. A gate oxide film 28 is then formed on the channel layer 27. A doped polycrystalline silicon layer, as a second conduction layer 29 for forming the gate electrode of the transfer transistor, is deposited on the gate oxide film 28 such that the opening 22a, which had been covered with the gate oxide film 28, is buried.

Then, as shown in FIG. 5g, the polycrystalline silicon layer is etched back to form a gate electrode 29a buried in the opening which had been covered with the gate oxide film 28. An oxide film, such as an USG (Undoped Silicate Glass) film, is formed as a second insulation film 30.

Figure 5H:
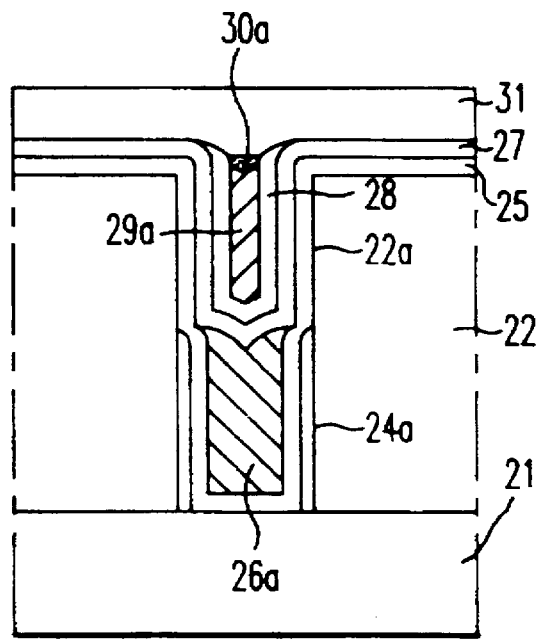

Next, as shown in FIG. 5h, the oxide film is etched back leaving an insulation film 30a on the gate electrode 29a, and part of the gate oxide film 28 exposed by the above process is etched thereby exposing the channel layer 27 on the dielectric film 25. Then, a conduction layer 31 in contact with the exposed channel layer 27 is formed by depositing, for example, a doped polycrystalline silicon over the entire dielectric film 25.

Next, as shown in FIG. 5i, a photosensitive film is coated on the conduction layer 31 and then exposed selectively and developed into a predetermined photosensitive film pattern 32. The conduction layer 31 and the channel layer 27 are etched successively using the photosensitive film pattern 32 as a mask.

Then, as shown in FIG. 5j, the photosensitive film pattern 32 is removed. A third insulation film 33 of an oxide film, for example, is formed on the dielectric film 25, and a portion of the film is selectively removed to form an opening 33a exposing a surface of the conduction layer 31 to form a bit line contact. A metal layer is formed thereon which is patterned into a bit line 34 using a predetermined pattern.

Because a portion the channel layer 27 in contact with the top of the capacitor storage node 26a is doped with impurities from the doped polycrystalline silicon of the storage node 26a, a self-aligned drain region is formed therein. Furthermore, since the portion of the channel layer 27 in contact with the conduction layer 31 of the bit line contact is doped with impurities from the doped polycrystalline silicon of the conduction layer 31, a self-aligned source region is formed therein.

Because the second embodiment DRAM cell fabricated through the foregoing processes is vertically arranged on the substrate 1 with the capacitor having a first capacitor electrode 24a, a capacitor dielectric film 25, and a storage node 26a, with the TFT structured transfer transistor having a channel layer 27, a gate insulation film 28, and a gate electrode 29a over the capacitor, and with the bit line 13 in contact with an upper part of the transfer transistor, the area occupied by the memory cell can be reduced.

As has been explained, since the area occupied by the cell is reduced by forming the capacitor and the transfer transistor vertically, this invention allows high density integration of semiconductor memory devices. Furthermore, since the trench and the opening are formed in the substrate and the insulation film, with the transfer transistor and the capacitor formed therein, step size on the substrate can be reduced. Moreover, since the transfer transistor is formed in a TFT structure, isolation between cells is easily attained.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor memory device comprising:

a semiconductor substrate having a trench;

a first insulation film on the substrate;

the first insulation film having an opening above the trench;

a capacitor including a dielectric film in the trench and a storage node in the trench on the dielectric film;

a transfer transistor in the opening of the first insulation film including a channel layer on the storage node, a gate insulation film on the channel layer, and a gate electrode on the gate insulation film;

a second insulation film on the gate electrode;

a conduction layer on the second insulation film;

a third insulation film in contact with the channel layer; and a bit line in contact with the conduction layer.

2. The device of claim 1, wherein the dielectric film of the capacitor is further formed in the opening and on an upper surface of the insulation film.

3. The device of claim 1, wherein the transfer transistor has a thin film transistor structure.

4. The device of claim 1, wherein in a portion of the channel layer is in contact with the conduction layer to form a source region of the transfer transistor.

5. The device of claim 1, wherein a portion of the channel layer is in contact with the storage node to form a drain region of the transfer transistor.

6. A semiconductor memory device comprising:

a semiconductor substrate;

a first insulation film on the substrate, the first insulation film having an opening;

a capacitor in the opening in the first insulation film including a first capacitor electrode, a dielectric film on the first capacitor electrode, and a storage node on the dielectric film;

a transfer transistor in the opening at the first insulation film including a channel layer on the storage node, a gate insulation film on the channel layer, and a gate electrode on the gate insulation film;

a second insulation film on the gate electrode;

a conduction layer and a third insulation film on the channel layer and the gate insulation film; and a bit-line in contact with the conduction layer.

7. The device of claim 6, wherein the dielectric film of the capacitor is further formed on an upper surface of the first insulation film.

8. The device of claim 6, wherein the transfer transistor has a thin film transistor structure.

9. The device of claim 6, wherein a portion of the channel layer is in contact with the conduction layer to form a source region of the transfer transistor.

10. The device of claim 6, wherein a portion of the channel layer is in contact with the storage node to form a drain region of the transfer transistor.

11. A method of fabricating a semiconductor memory device, the method comprising the steps of:

forming a first insulation film on a semiconductor substrate;

forming an opening in the first insulation film by selectively etching the first insulation film;

forming a trench in the semiconductor substrate below the opening by etching the semiconductor substrate;

forming a dielectric film in the trench and the opening and on the first insulation film;

forming a storage node in the trench on the dielectric film;

forming a channel layer on the dielectric film and the storage node;

forming a gate insulation film on the channel layer;

forming a gate electrode on the gate insulation film buried in the opening;

forming a second insulation film on the gate electrode;

etching the channel layer except in the vicinity of the opening;

forming a conduction layer on the gate insulation film, the channel layer, and the second insulation film;

patterning the conduction layer and the channel layer;

forming a third insulation film on exposed portions of the dielectric film, the conduction layer, and the channel layer;

selectively etching the third insulation film to expose a portion of the conduction layer; and forming a bit line on the third insulation film and contacting the portion of the conduction layer.

12. The method of claim 11, wherein the step of forming the storage node includes the steps of forming a first conduction layer on the dielectric film so that the trench and the opening are filled with the first conduction layer and etching the first conduction layer back leaving the first conduction layer only in the trench.

13. The method of claim 12, wherein the first conduction layer is formed of deposited doped polycrystalline silicon.

14. The method of claim 11, wherein the channel layer is formed of deposited silicon.

15. The method of claim 11, wherein the step of forming the gate electrode includes the steps of depositing a second conduction layer on the gate insulation film so that the opening is filled with the second conduction layer and etching back the second conduction layer.

16. The method of claim 11, wherein the conduction layer is formed of doped polycrystalline silicon.

17. The method of claim 11, wherein a portion of the channel layer in contact with the conduction layer is doped with impurities from the conduction layer to form a self-aligned source region of a transfer transistor, and a portion of the channel layer in contact with a top of the storage node is doped with impurities from the storage node to form a self-aligned drain region of the transfer transistor.

18. A method for fabricating a semiconductor memory device comprising the steps of:

forming a first insulation film on a semiconductor substrate;

forming an opening in the first insulation film by selectively etching the first insulation film;

forming a first capacitor electrode at a lower portion of the opening;

forming a dielectric film on the first insulation film, the first capacitor electrode and the semiconductor substrate, in the opening;

forming a storage node in a portion of the opening covered with the dielectric film;

forming a channel layer on the storage node and the dielectric film;

forming a gate insulation film on the channel layer;

forming a gate electrode on the gate insulation film buried in the opening;

forming a second insulation film on the gate electrode;

etching the channel layer except in the vicinity of the opening;

forming a second conduction layer on the channel layer and the second insulation film;

patterning the second conduction layer and the channel layer;

forming a third insulation film on the exposed dielectric film;

exposing a surface of the conductive layer by selectively etching the third insulation film; and forming a bit line on the third insulation film in contact with the exposed surface of the conduction layer.

19. The method of claim 18, wherein the step forming the first capacitor electrode includes the steps of forming a first conduction layer on the first insulation film including the opening and etching the first conduction layer back leaving the first conduction layer on sidewalls at the lower portion of the opening.

20. The method of claim 18, wherein the step of forming the storage node includes the steps of forming a first conduction layer on the dielectric film so that the first conduction layer is buried in the opening and etching back the first conduction layer.

21. The method of claim 20, wherein the first conduction layer is formed of deposited doped polycrystalline silicon.

22. The method of claim 18, wherein the channel layer is formed of deposited silicon.

23. The method of claim 18, wherein the step of forming the gate electrode includes the steps of depositing a second conduction layer on the gate insulation film so that the opening is filled with the second conduction layer and etching the second conduction layer back.

24. The method of claim 18, wherein the second conduction layer is formed of deposited doped polycrystalline silicon.

25. The method of claim 18, wherein a portion of the channel layer in contact with the conduction layer is doped with impurities from the conduction layer to form a self-aligned source region of a transfer transistor, and a portion of the channel layer in contact with a top of the storage node is doped with impurities from the storage node to form a self-aligned drain region of the transfer transistor.

26. A semiconductor device comprising:

a semiconductor substrate;

a recess in the semiconductor substrate;

a first insulation film on the semiconductor substrate having an opening aligned with the recess;

a dielectric film on exposed surfaces of the recess and the opening;

a first conduction layer in the recess on the dielectric film;

a semiconductor layer on side surfaces of the dielectric film in the opening and on the first conduction layer; and a third conduction layer on an upper surface of the second insulation film, the third conduction layer contacting an exposed portion of the semiconductor layer.

27. A semiconductor device comprising:

a semiconductor substrate;

a first insulation film on the semiconductor substrate, the first insulation film having an opening;

a first conduction layer on a lower surface portion of the opening;

a dielectric film on a surface of the opening adjacent to the first conduction layer;

a semiconductor layer on a side surface of the dielectric film and on the first conduction layer;

a second insulation film on the semiconductor layer in the opening;

a second conduction layer in the opening, the second conduction layer surrounded by the second insulation film on the semiconductor layer; and a third conduction layer on the second insulation film, the third conduction layer contacting an exposed portion of the semiconductor layer.

28. A method of fabricating a semiconductor memory device, the method comprising the steps of:

forming a first insulation film on a semiconductor substrate;

forming an opening through the first insulation film by selectively etching the first insulation film;

forming a recess in the semiconductor substrate by etching the semiconductor substrate, the recess being aligned with the opening;

forming a dielectric film on the recess and on an exposed surface of the first insulation film;

forming a storage node on the dielectric film in the recess;

forming a channel layer on the dielectric film in the opening and on the storage node;

forming a gate insulation film on the channel layer;

forming a gate electrode on the gate insulation film in the opening;

forming a second insulation film on the gate electrode to be in contact with the gate insulation film; and forming a conduction layer on the second insulation film and on an exposed portion of the channel layer.

* * * * *